United States Patent
Chen et al.

(10) Patent No.: US 9,155,189 B1
(45) Date of Patent: Oct. 6, 2015

(54) MULTI-LAYER PRINTED CIRCUIT BOARD STRUCTURE, CONNECTOR MODULE AND MEMORY STORAGE DEVICE

(71) Applicant: PHISON ELECTRONICS CORP., Miaoli (TW)

(72) Inventors: Yun-Chieh Chen, Miaoli County (TW); Shih-Kung Lin, Hsinchu County (TW); Ta-Chuan Wei, Miaoli County (TW); Hsiang-Hsiung Yu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/297,646

(22) Filed: Jun. 6, 2014

(30) Foreign Application Priority Data

Apr. 18, 2014 (TW) .............................. 103114229 A

(51) Int. Cl.
*H01L 23/14* (2006.01)
*H01L 23/522* (2006.01)
*H05K 1/02* (2006.01)
*G11C 5/02* (2006.01)
*H05K 1/11* (2006.01)
*H01R 13/66* (2006.01)
*H01R 13/6581* (2011.01)

(52) U.S. Cl.
CPC ................ *H05K 1/0219* (2013.01); *G11C 5/02* (2013.01); *H01L 23/14* (2013.01); *H01L 23/5225* (2013.01); *H01R 13/6581* (2013.01); *H01R 13/665* (2013.01); *H05K 1/0224* (2013.01); *H05K 1/0225* (2013.01); *H05K 1/0227* (2013.01); *H05K 1/0298* (2013.01); *H05K 1/111* (2013.01); *H05K 2201/0723* (2013.01)

(58) Field of Classification Search
CPC ..... H01L 23/14; H01L 23/5225; H01L 23/60; H05K 1/0219; H05K 1/0224; H05K 1/0225; H05K 1/0227; H01R 13/6594; H01R 13/6587; H01R 13/6658
See application file for complete search history.

(56) References Cited

U.S. PATENT DOCUMENTS

2009/0244877 A1* 10/2009 Yeh et al. ...................... 361/818
2013/0313013 A1* 11/2013 Porta et al. .................... 174/268

* cited by examiner

*Primary Examiner* — Phat X Cao
(74) *Attorney, Agent, or Firm* — Jianq Chyun IP Office

(57) ABSTRACT

A multi-layer printed circuit board structure, a connector module and a memory storage device are provided. The multi-layer printed circuit board structure includes a first layout layer and a second layout layer. The first layout layer includes a shielding element and at least one pad. The shielding element provides the grounding voltage. The second layout layer is disposed corresponding to the first layout layer and includes at least one wire, and one end of each wire is coupled to one of the pads. A predefined proportion of the wire is covered by a projection plane of the shielding element projected on the second layout layer.

18 Claims, 7 Drawing Sheets

MULTI-LAYER PRINTED CIRCUIT BOARD STRUCTURE, CONNECTOR MODULE AND MEMORY STORAGE DEVICE

CROSS-REFERENCE TO RELATED APPLICATION

This application claims the priority benefit of Taiwan application serial no. 103114229, filed on Apr. 18, 2014. The entirety of the above-mentioned patent application is hereby incorporated by reference herein and made a part of this specification.

BACKGROUND

1. Technology Field

The present invention is directed to a layout of a printed circuit board (PCB) and more particularly, to a multi-layer printed circuit board (MLPCB) structure, a connector module and a memory storage device.

2. Description of Related Art

With advancement of technologies for manufacturing printed circuit boards (PCB) and electronic components, the printed circuit boards and the electronic components are tended to be designed with small sizes to meet the demands for miniaturization of electronic products. However, reduction of a size of a printed circuit board results in less area available for layout on the printed circuit board. A layout design of a multilayer printed circuit board (MLPCB) is therefore proposed to increase the layout area based on a premise that the size of the printed circuit board is not increased. Generally, in the layout design of the multilayer printed circuit board, signal layers are disposed on outer layers of the multilayer printed circuit boards, while a power layer and a ground layer are disposed on an inner layer of the multilayer printed circuit board. However, in such layout manner, signals transmitted on the signal layers may cause electromagnetic interference (EMI) to electronic apparatuses nearby.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention provides a multi-layer printed circuit board (MLPCB) structure, a connector module and a memory storage device, which can effectively reduce the electromagnetic interference (EMI) caused to other electronic apparatuses.

According to an exemplary embodiment of the present invention, a MLPCB structure suitable for being connected to a connector is provided. The connector includes at least one connection terminal, and the MLPCB structure includes a first layout layer and a second layout layer. The first layout layer includes a shielding element and at least one pad. The shielding element is configured to provide the grounding voltage. The at least one pad is coupled to the at least one connection terminal. The second layout layer is disposed corresponding to the first layout layer and includes at least one wire, and one end of each wire is coupled to one of the pads. A predefined proportion of the wire is covered by a projection plane of the shielding element projected on the second layout layer.

According to an exemplary embodiment of the present invention, a connector module including a connector and a MLPCB structure is provided. The connector includes at least one connection terminal. The MLPCB structure is connected to the connector and includes a first layout layer and a second layout layer. The first layout layer includes a shielding element and at least one pad. The shielding element is configured to provide the grounding voltage. The at least one pad is coupled to the at least one connection terminal. The second layout layer is disposed corresponding to the first layout layer and includes at least one wire, and one end of each wire is coupled to one of the pads. A predefined proportion of the wire is covered by a projection plane of the shielding element projected on the second layout layer.

According to another exemplary embodiment of the present invention, a memory storage device is provided. The memory storage device includes a connector, a connection interface unit, a rewritable non-volatile memory module, a memory controlling circuit unit and a MLPCB structure. The connector includes at least one connection terminal. The rewritable non-volatile memory module includes a plurality of physical erasing units. The memory controlling circuit unit is coupled to the connection interface unit and the rewritable non-volatile memory module. The MLPCB structure is connected to the connector and configured to disposing the connection interface unit or the memory controlling circuit unit. The MLPCB structure includes a first layout layer and a second layout layer. The first layout layer includes a shielding element and at least one pad. The shielding element is configured to provide the grounding voltage. The at least one pad is coupled to the at least one connection terminal. The second layout layer is disposed corresponding to the first layout layer and includes at least one wire, and one end of each wire is coupled to one of the pads. A predefined proportion of the wire is covered by a projection plane of the shielding element projected on the second layout layer.

To sum up, contrasting to the conventional MLPCB structure, in an exemplary embodiment of the present invention, some wires are disposed on the second layout layer rather than the first layout layer, and the shielding element is disposed on the corresponding position on the first layout layer. Thereby, the EMI caused to the nearby electronic apparatuses due to the signal transmitted on the wires can be effectively reduced.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
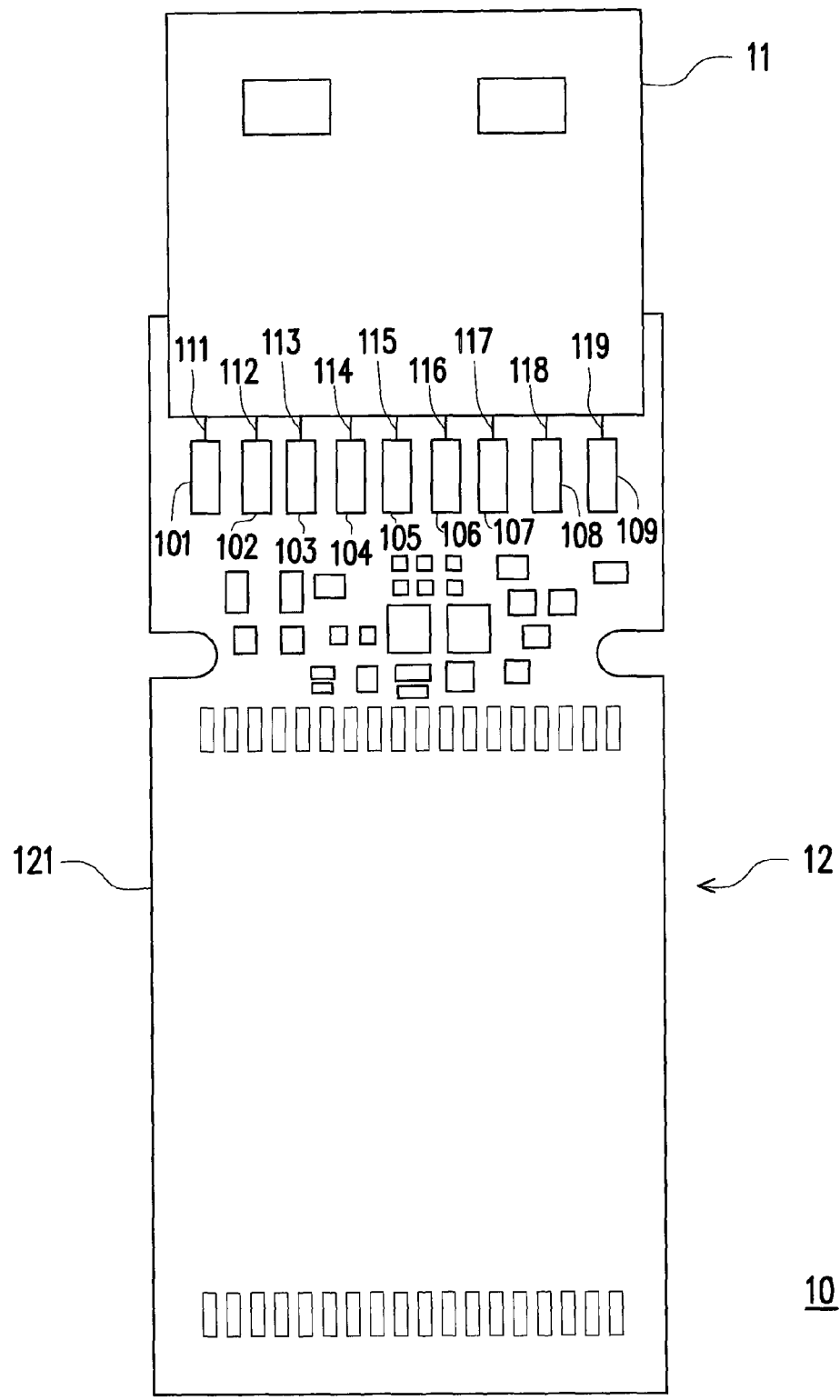
FIG. 1 is a schematic diagram of a connector module according to an exemplary embodiment of the present invention.

Reference will now be made in detail to the present preferred embodiments of the present invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

FIG. 1 is a schematic diagram of a connector module according to an exemplary embodiment of the present invention.

With reference to FIG. 1, a connector module 10 includes a connector 11 and a multi-layer printed circuit board (MLPCB) structure 12. In the present exemplary embodiment, the connector module 10 complies with a universal serial bus (USB) standard, such as the USB 2.0 or the USB 3.0 standard, but the present invention is not limited thereto. The connector includes connection terminals 111 to 119. The connection terminals 111 to 119 may be made of any conductive materials (e.g., metal or non-metal). The connection terminals 111 to 119 may be partially exposed out of the connector 11 (as shown in FIG. 1) or may be covered in the connector 11 and invisible from outside.

The MLPCB structure 12 is connected with the connector 11. For example, the MLPCB structure 12 may be connected with the connector 11 by means of soldering, bonding or locking, which is not limited in the present invention.

Figure 2:
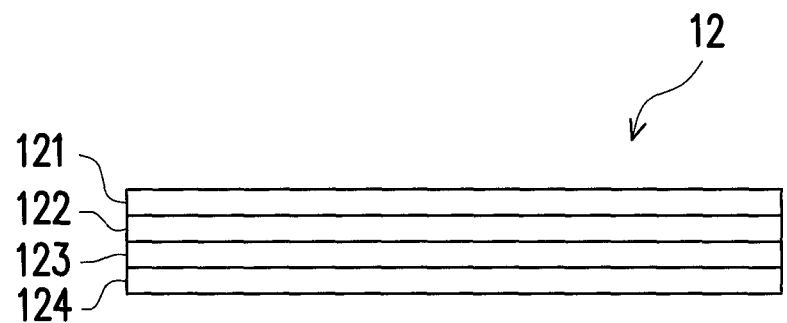
FIG. 2 is a side-view diagram of the multi-layer printed circuit board (MLPCB) structure according to an exemplary embodiment of the present invention.

FIG. 2 is a side-view diagram of the MLPCB structure according to an exemplary embodiment of the present invention.

With reference to FIG. 2, The MLPCB structure 12 includes layout layers 121 to 124, and each of the layout layers 121 to 124 is disposed corresponding to each other. An adhesive layer (not shown) may be disposed between each of the layout layers 121 to 124 for bonding each of the layout layers 121 to 124. Viewing from top to bottom, the layout layer 121 may be considered as a first layout layer, the layout layer 122 may be considered as a second layout layer, the layout layer 123 may be considered as a third layout layer, and the layout layer 124 may be considered as a fourth layout layer. The layout layers 121 and 124 are located at outer sides of the MLPCB structure 12, and the layout layers 122 and 123 are located inside the MLPCB structure 12. In the present exemplary embodiment, the layout layers 121 and 124 are signal layers and serve for disposing wires for transmitting signals (i.e., signal wires), electronic chips or components. The layout layer 122 is a power layer and serves for laying out wires for power supply. The layout layer 123 is a ground layer and serves for laying out grounding components to provide a grounding voltage. Additionally, each of the layout layers 121 to 124 may communicate with each other via the through holes. However, in another exemplary embodiment, the MLPCB structure 12 may include more or less layout layers, and the usage of each layout layer may be adjusted, which is not limited in the aforementioned embodiment.

With reference to FIG. 1 again, the layout layers 121 of the MLPCB structure 12 includes pads 101 to 109. The pads 101 to 109 are disposed on the layout layer 121 and used to be coupled to the connection terminals 111 to 119. The pads 101 to 109 may be made of any conductive material (e.g., metal or non-metal). In other words, via the connection terminals 111 to 119 and the pads 101 to 109, signal may be transmitted between the connector 11 and the MLPCB structure 12. Each of the pads 101 to 109 is connected to one of the connection terminals 111 to 119 and is used to transmit a specific type of signal. For instance, in the present exemplary embodiment, according to the USB 3.0 standard, the pads 102 and 103 are in charge of transmitting signal from the connector 11, and the pads 107 and 108 are in charge of transmitting signal from the MLPCB structure 12.

Generally, if there is enough layout space on the layout layers 121 and 124, all signal wires are laid out on the layout layers 121 and 124 which is on the top and the bottom ends of the MLPCB structure 12. Only in few circumstances, such as no layout space is available on the layout layers 121 and 124, some signal wires may be laid out on the layout layers 122 and 123 located inside. However, when signal is transmitted to the connector 11 via signal wires disposed on the layout layer 121 or 124, the electromagnetic radiation generated by the transmitted signal may cause electromagnetic interference (EMI) to nearby electronic apparatuses due to no shielding is provided on the outer sides. For instance, when the signal is transmitted on the layout layer 121, some communication bands of wireless electronic devices, such as Bluetooth earphones or Bluetooth mouse located nearby, may be interfered. Especially, the EMI caused by the signal transmitted from the MLPCB structure 12 to the connector 11 is especially significant. Accordingly, in the present exemplary embodiment, at least a portion of the signal wires used to transmit signal to the connector 11 (which are also referred to as signal transmitting wires) are laid out on the layout layer 122, and one or more shielding elements are disposed on corresponding positions on the layout layer 121 so as to shield the EMI generated by the signal-transmitting wires located beneath the shielding elements.

FIG. 3 to FIG. 6 are schematic diagrams illustrating a layout strategy of each layout layer of the MLPCB structure according to an exemplary embodiment of the present invention.

Figure 3:
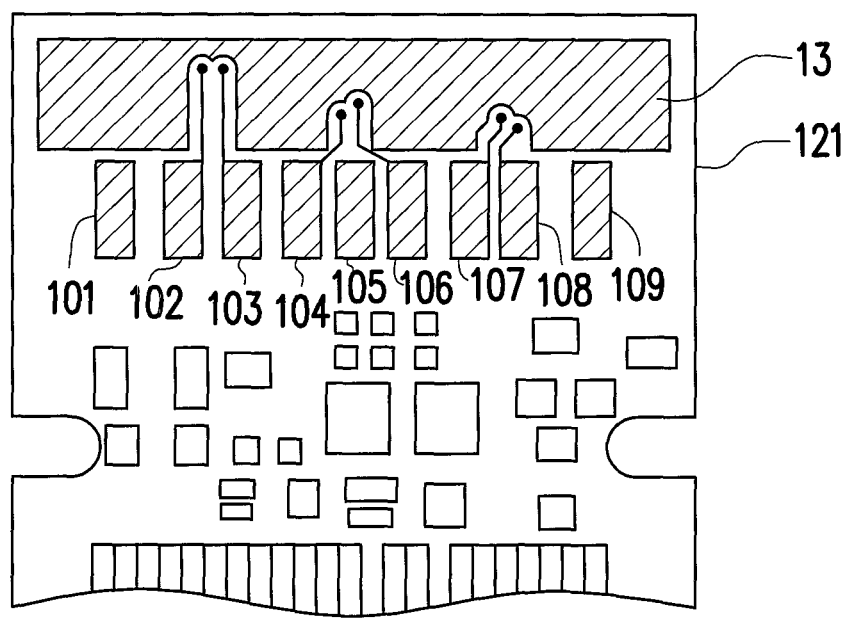
FIG. 3 to FIG. 6 are schematic diagrams illustrating a layout strategy of each layout layer of the MLPCB structure according to an exemplary embodiment of the present invention.

With reference to FIG. 3, the layout layer 121 includes a shielding element 13 and the pads 101 to 109. The shielding element 13 is configured to provide grounding voltage. The shielding element 13 may be integral (seamless) or composed of a plurality of small shielding members, such that large or small gaps may exist between each of the shielding members. In the present exemplary embodiment, the shielding element 13 may be made of copper foil. However, in another exemplary embodiment, the shielding element 13 may also be made of other material capable of shielding the EMI, instead of material (e.g., alumina) that contributes to radiate electromagnetic waves.

Moreover, with reference to FIG. 1 and FIG. 3, if a side on the MLPCB structure 12 which is closer to the connector 11 is defined as a first side, and the other side on the MLPCB structure 12 which is away from the connector 11 and opposite to the first side is defined as a second side, the position of the shielding element 13 on the layout layer 121 nears the first side. For instance, in an exemplary embodiment, the shielding element 13 may lean against or be adhered to the first side. Alternatively, in another exemplary embodiment, the position of the shielding element 13 on the layout layer 121 is nearer the first side rather than the second side.

Figure 4:
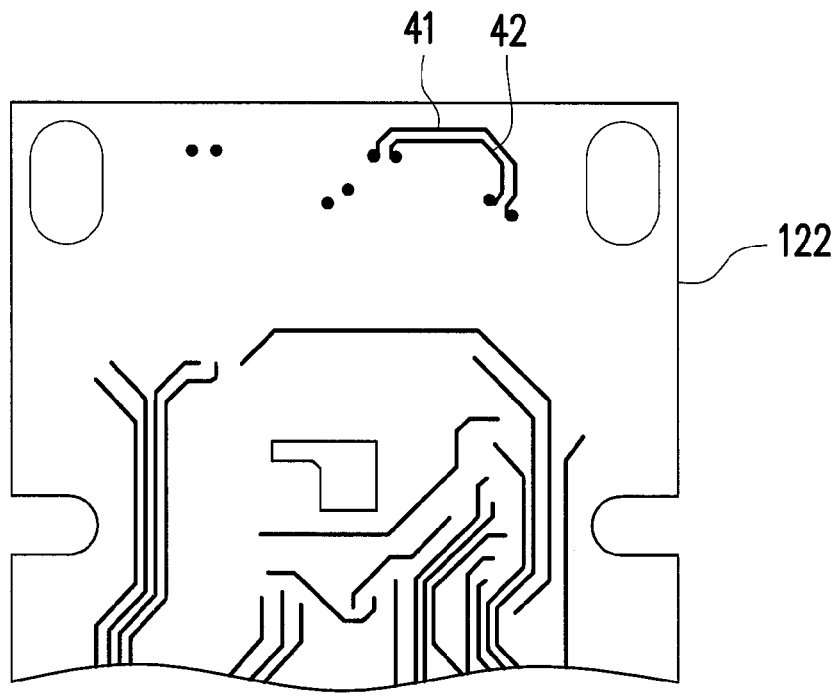
Figure 5:
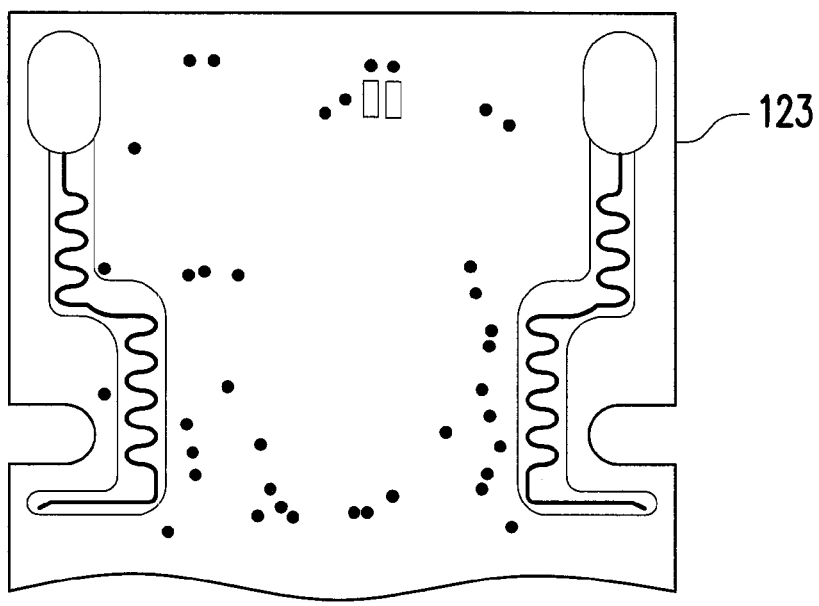
Figure 6:
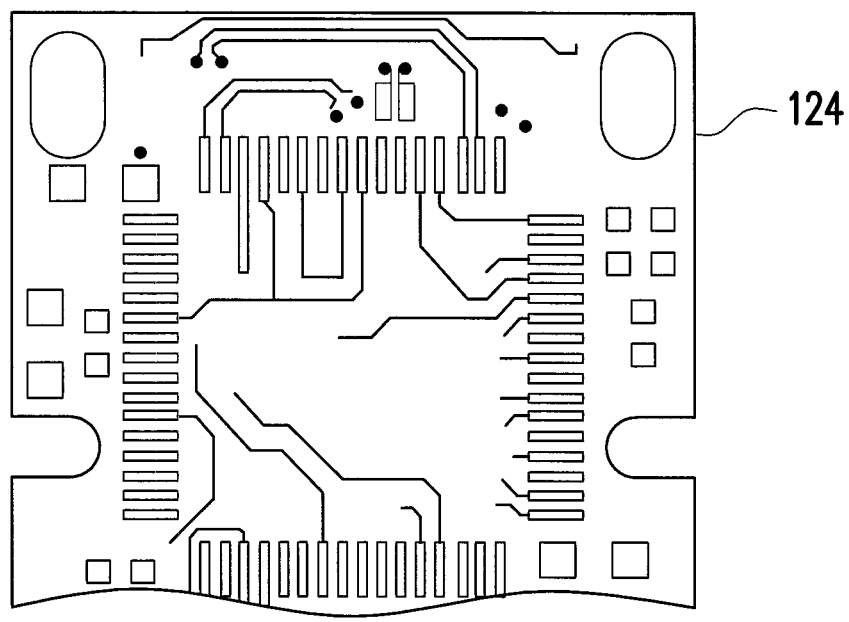

With reference to FIG. 4, the layout layer 122 includes wires 41 and 42, and each of the wires 41 and 42 is coupled to one of the connection terminals 101 to 109. For instance, referring to FIG. 3 and FIG. 4, one end of the wire 41 is coupled to the pad 107, and one end of the wire 42 is coupled to the pad 108, and the wires 41 and 42 are used to transmit signal that needs to be transmitted to the connector 11. The projection plane of the shielding element 13 projected on the layout layer 122 covers a predefined proportion of the wires 41 and 42. Alternatively, in other words, viewing along a normal vector direction of the layout layer 121 or 122, the shielding element 13 covers a predefined proportion of the wires 41 and 42. For instance, in the present exemplary embodiment, the predefined proportion is 100%, and thus, the projection plane of the shielding element 13 projected on the layout layer 122 completely covers the wires 41 and 42. Alternatively, in another exemplary embodiment, according to different predefined proportions (e.g., 50% to 99%), the projection plane of the shielding element 13 projected on the layout layer 122 may completely cover the wire 41, completely cover the wire 42, merely cover a portion of the wire 41 or merely cover a portion of the wire 42, which is not limited in the present invention. With the shielding element 13 disposed above at least one of the wires 41 and 42, the EMI caused to nearby electronic apparatuses due to the signal transmitted on the wires 41 and 42 can be effectively reduced. Additionally, in an exemplary embodiment, it may be a scenario where only the wire 41 is laid out on the layout layer 122, and the wire 42 is laid out on the layout layer 121, or a scenario where only the wire 42 is laid out on the layout layer 122, and the wire 41 is laid out on the layout layer 121. Alternatively, the other wires or components which may cause affection to the other electronic apparatuses or devices due to some effects (e.g., the coupling effect) may be changed from being disposed on the layout layer 121 located outside to be disposed on the layout layer 122 located inside, and the shielding elements may be disposed on the corresponding positions on the layout layer 121 to shield the electromagnetic radiation. Next, referring to FIG. 5 and FIG. 6, passing through the layout layer 123, the wires 41 and 42 are coupled to the electronic chips and/or components on the layout layer 124. It should be noted that due to limitations of the manufacturing process, there are still some wires connected to the pads 107 and 108 not be changed to be laid out on the layout layer 122 in FIG. 3. However, in case that the manufacturing process can afford, the wires connected to the pads 107 and 108 which are illustrated in FIG. 3 may totally be changed to be laid out on the layout layer 122, and the shielding element 13 is extended for filling the vacated area.

In another exemplary embodiment, wires in charge of transmitting signal to the connector 11 and wires in charge of receiving signal from the connector 11 (which are also referred to as signal-receiving signals) are both laid out on the layout layer 122 located inside, instead of the layout layer 121 on the outer side.

FIG. 7 to FIG. 10 are schematic diagrams illustrating a layout strategy of each layout layer of the MLPCB structure according to another exemplary embodiment of the present invention. The difference between the present exemplary embodiment and the exemplary embodiments illustrated in FIG. 3 to FIG. 6 is, in the exemplary embodiments illustrated in FIG. 3 to FIG. 6, the wires in charge of transmitting signal from the connector 11 are laid out on the layout layer 121, however, in the present exemplary embodiment, the wires in charge of transmitting signal from the connector 11 are laid out on the layout layer 122. Thereby, besides the EMI may be reduced, some problems due to coupling may also be improved.

Figure 7:
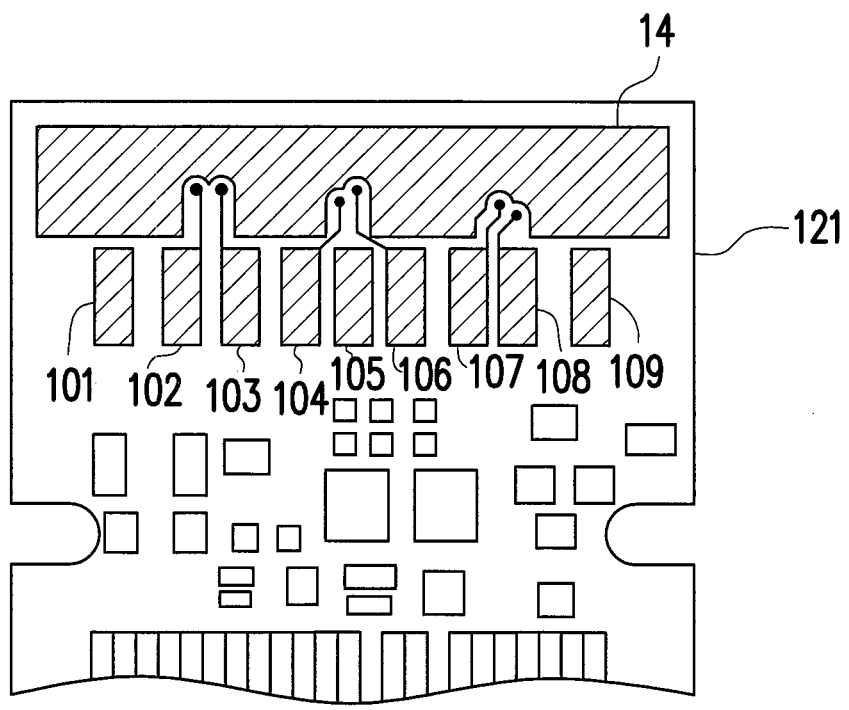
FIG. 7 to FIG. 10 are schematic diagrams illustrating a layout strategy of each layout layer of the MLPCB structure according to another exemplary embodiment of the present invention.

Referring to FIG. 7, the layout layer 121 includes a shielding element 14 and the pads 101 to 109. The layout strategy and the material of the shielding element 14 are the same as or similar to the shielding element 13.

Figure 8:
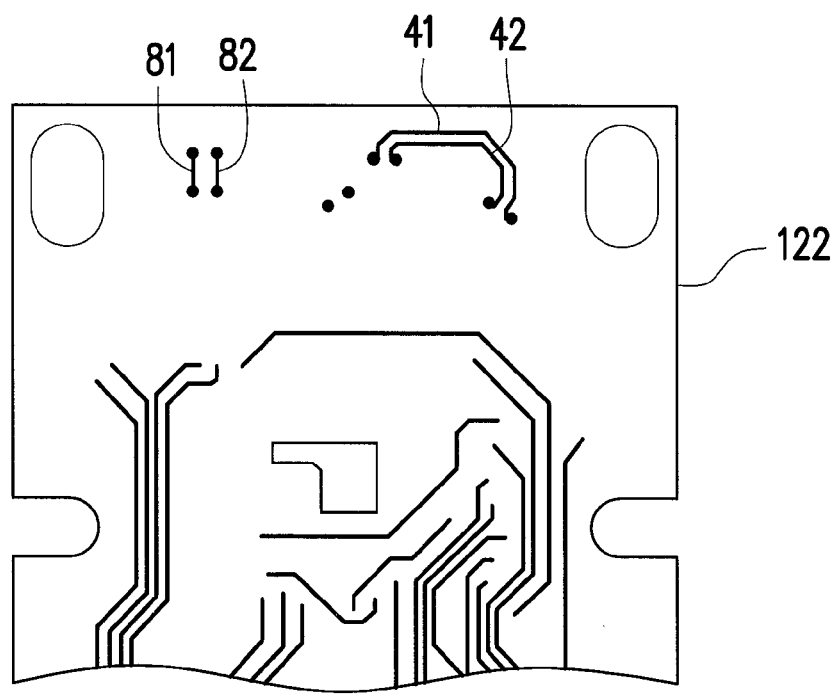
Figure 9:
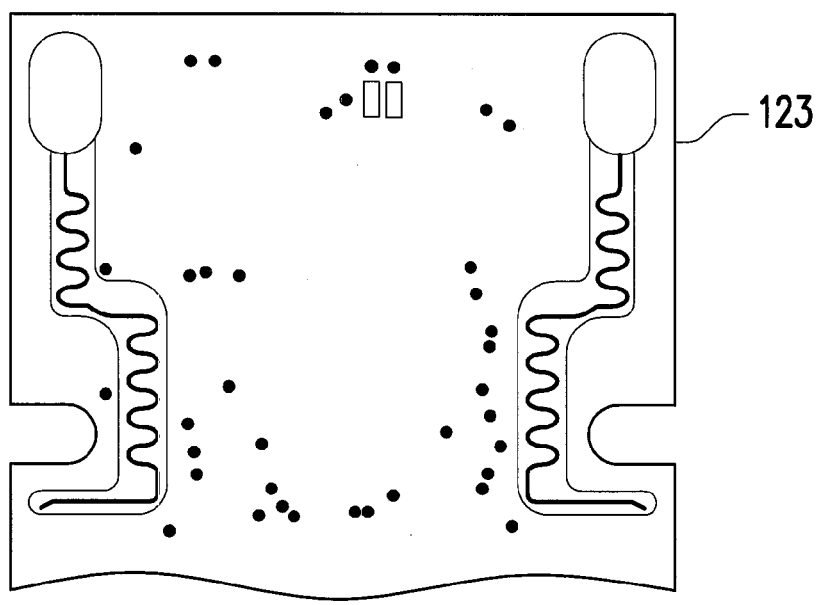
Figure 10:
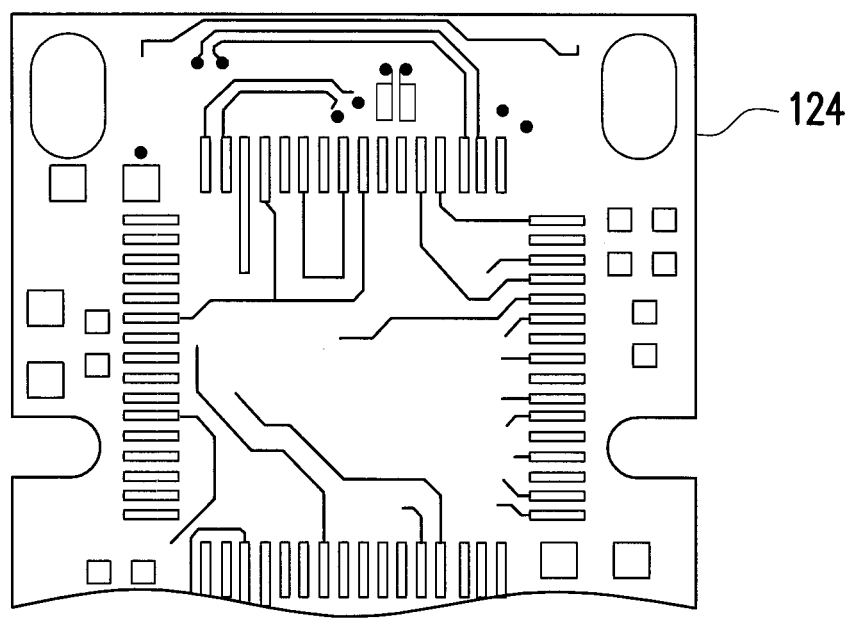

Referring to FIG. 8, the layout layer 122 includes wires 41, 42, 81 and 82. The wire 41 is coupled to the pad 107, the wire 42 is coupled to the pad 108, the wire 81 is coupled to the pad 102, and the wire 82 is coupled to the pad 103. The wires 41 and 42 are used to transmit signal that needs to be transmitted to the connector 11, and the wires 81 and 82 are used to transmit signal from the connector 11. Similarly, it may be a scenario where only the wire 81 is laid out on the layout layer 122, and the wire 82 is laid out on the layout layer 121. Alternatively, it may be a scenario where only the wire 82 is laid out on the layout layer 122, and the wire 81 is laid out on the layout layer 121. It is to be mentioned that the area of the shielding element 14 is larger than the area of the shielding element 13 so as to cover the wires 81 and 82 that are changed to be laid out beneath the shielding element 14. Next, referring to FIG. 9 and FIG. 10, passing through the layout layer 123, the wires including 41, 42, 81 and 82 are coupled to the electronic chips and/or components on the layout layer 124. Similar to FIG. 3, in a scenario that the manufacturing process can afford, the wires connected to the pads 102, 103, 107 and 108 which are illustrated in FIG. 7 may be changed to be totally laid out on the layout layer 122 as possible, and the shielding element 14 is extended for filling the vacated area.

In another perspective, in the conventional layout strategy, the signal wires may also be laid out on the layout layer (e.g., a power layer) located inside, but the major reason to do so is commonly because the signal layer located outside does not have enough layout space. In this case, other wires or components may be disposed on the signal layer located outside, and the disposed position of the other wires or components may be on or near the projection positions (i.e., overlapping position) of the signal wires which are laid out on the layout layer (e.g., the power layer) located inside. However, in an exemplary embodiment of the present invention, the reason to lay out the signal wires on the layout layer 122 is not because there is no sufficient layout space on the layout layer 121 or 124. Especially, the projection positions (i.e., overlapping positions) of the signal wires which are laid out on the layout layer 122 projected on the layout layer 121 are covered by corresponding shielding elements, rather than having the other wires or components disposed thereon. Additionally, in the conventional layout strategy, even though some grounding elements may be disposed on the signal layers located outside, but the grounding elements are not for the purpose of shielding the signal wires beneath the grounding elements. Therefore, the area of the grounding elements takes a small proportion (e.g., less than 10%) of the area of the signal layers located outside so as to provide more spaces for laying out the signal wires. However, in an exemplary embodiment of the present invention, the area of the shielding element disposed on the layout layer 121 may be as large as possible and exceed the area of the conventional grounding components which are disposed simply for grounding, so as to effectively shield the signal wires therebeneath. For example, in an exemplary embodiment, the shielding element disposed on the layout layer 121 or the projection plane thereof on the layout layer 121 or 122 at least takes 10% to 20% of the area of the layout layer 121 or even more. Additionally, in an exemplary embodiment of the present invention, the position of the shielding element may be very close to the connector 11, and the closer to the connector 11, the more area of the layout layer 121 covered by the shielding element is (or the higher density of area of the layout layer 121 covered by the shielding element is) so as to obtain a better shielding effect for the signal wires. In addition, the disposition of the shielding element is not limited to that illustrated in FIG. 3 and FIG. 7. The area of the layout layer 121 which is covered by the shielding element may also be increased or reduced according to the distribution of the wires on the layout layer 122 which needs to be shielded and/or an evaluation standard, such as the EMI evaluation standard which needs to be reached.

It should be noted that in the exemplary embodiment illustrated in FIG. 1 to FIG. 10, the layout structures of the connector module 10 are only examples. The actual layout structure of the connector module 10 is determined depending on its corresponding appearance, standard and circuit design, which is not limited in the present invention. In a present exemplary embodiment, the aforementioned connector module 10 may be applied to an adapter cable (e.g., a USB cable). Alternatively, in another exemplary embodiment, the aforementioned connector module 10 may also be applied in a memory storage device, and the memory storage device is used with a host system.

Figure 11:
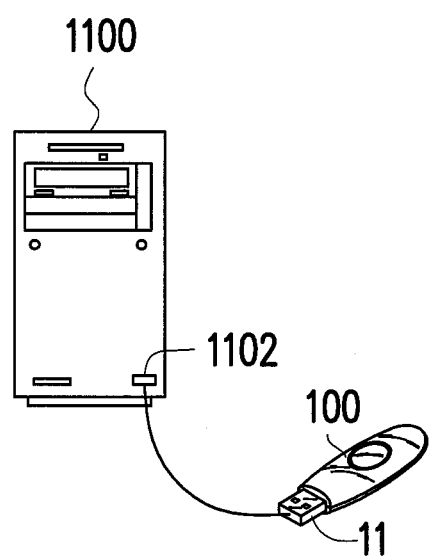
FIG. 11 illustrates a host system and a memory storage device according to an exemplary embodiment of the present invention.

FIG. 11 illustrates a host system and a memory storage apparatus according to an exemplary embodiment of the present invention.

Referring to FIG. 11, a memory storage device 100 includes a connector module 10, and a host system 1100 can substantially be any system collocated with the memory storage device 100 for storing or reading data. In the present exemplary embodiment, the host system 1100 is a computer system. Nevertheless, in an exemplary embodiment of the present invention, the host system 1100 may be a system, such as a digital camera, a video camera, a communication device, an audio player, or a video player. In the present exemplary embodiment, the memory storage device 100 is an USB flash disk (as illustrated in FIG. 11). Alternatively, in another exemplary embodiment, the memory storage device 100 may also be a portable hard disk, an external optical disk, a SD card, a MMC card, a memory stick, a CF card, or an embedded storage device (e.g., an embedded MMC (eMMC)), which is not limited in the present invention.

The host system 1100 has a slot 1102, and the connector 11 is adaptive for being inserted into the slot 1102 of the host system 1100. After the connector 11 is inserted into the slot 1102, the memory storage device 100 can then be coupled to the host system 1100 through the connector 11, to transmit data to the host system 1100 or receive data from the host system 1100.

Figure 12:
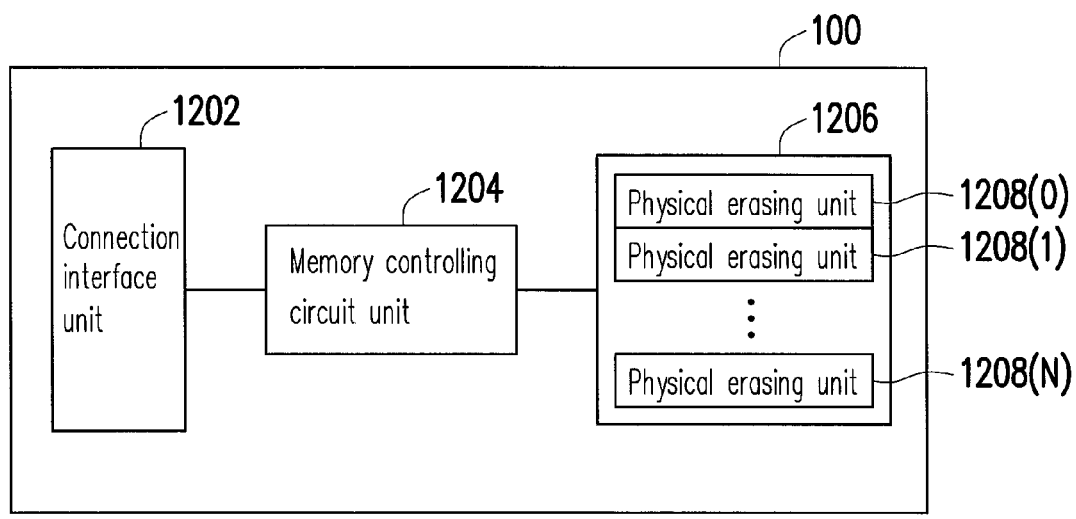
FIG. 12 is a schematic block diagram illustrating a memory storage device according to an exemplary embodiment of the present invention.

FIG. 12 is a schematic block diagram of a memory controlling circuit unit according to an exemplary embodiment of the present invention.

Referring to FIG. 12, the memory storage device 100 includes a connection interface unit 1202, a memory controlling circuit unit 1204, and a rewritable non-volatile memory module 1206.

In the present exemplary embodiment, the connection interface unit 1202 complies with the Universal Serial Bus (USB) standard. However, it should be understood that the present invention is not limited thereto, and the connection interface unit 1202 may also comply with the Parallel Advanced Technology Attachment (PATA) standard, the Institute of Electrical and Electronic Engineers (IEEE) 1394 standard, the peripheral component interconnect express (PCI Express) standard, the Serial Advanced the Technology Attachment (SATA) standard, the Ultra High Speed-I (UHS-I) interface standard, the Ultra High Speed-II (UHS-II) interface standard, the Secure Digital (SD) interface standard, the memory stick (MS) interface standard, the multi-media card (MMC) interface standard, the compact flash (CF) interface standard, the integrated device electronics (IDE) standard, or other suitable standards. In the present exemplary embodiment, the connection interface unit 1202 may be package with the memory controlling circuit unit 1204 in one chip or laid outside a chip having the memory controlling circuit unit 1204. Additionally, the connection interface unit 1202 and/or the memory controlling circuit unit 1204 are disposed on the MLPCB structure 12, such as in the central area of a portion of the layout layer 124 illustrated in FIG. 6 and FIG. 10 or any other position.

The memory controlling circuit unit 1204 is configured to execute a plurality of logic gates or control commands which are implemented in a hardware form or in a firmware form and perform operations such as data writing, reading or erasing in the rewritable non-volatile memory module 1206 according to the command of the host system 1100. For instance, the memory controlling circuit unit 1204 may include one or more electronic circuit, such as a CPU or a microprocessor, for the operations.

The rewritable non-volatile memory module 1206 is coupled to the memory controlling circuit unit 1204 and is configured to store data written by the host system 1100. The rewritable non-volatile memory module 1206 has a plurality of physical erasing units 1208(0)-1208(N). For instance, the physical erasing units 1208(0)-1208(N) may belong to the same memory die or different memory dies. Each of the physical erasing units includes a plurality of physical programming units, and the physical programming units belonging to the same physical erasing unit may be written separately but erased at the same time. For instance, each of the physical erasing units is composed of 128 physical programming units. However, it should be understood that the present invention is not limited thereto, and each of the physical erasing units may be composed of 64 or 256 programming units or any other number of physical programming units.

More specifically, each of the physical programming units includes a plurality of word lines and a plurality of bit lines, and a memory cell is disposed at an intersection of each of the word lines and each of the data lines. Each memory cell may store one or more bits. All of the memory cells in the same physical erasing unit are erased together. In the present exemplary embodiment, the physical erasing is the smallest unit for data erasing. That is to say, each of the physical erasing units has the least number of memory cells to be erased altogether. For instance, a physical erasing unit is a physical block. On the other hand, the memory cells on the same word line may be grouped into one or more of the physical programming units. If each memory cell is capable of storing two or more bits, the physical programming units on the same word line may be categorized into lower and upper physical programming units. In general, the writing speed of the lower physical programming units is greater than that of the upper physical programming units. In the present exemplary embodiment, each of the pages is the smallest unit for programming. Namely, each of the physical programming units is the smallest unit for writing data. For instance, the physical programming units may be physical pages or physical sectors. In case that the physical programming units are the physical pages, each of the physical programming units generally includes a data bit area and a redundant bit area. The data bit area includes a plurality of physical sectors for storing data of users, and the redundant bit area is configured for storing system data (e.g., error correcting codes). In the present exemplary embodiment, each data bit area contains 32 physical sectors, and the size of each physical sector is 512 bytes (512 B). However, in other exemplary embodiments, the data bit region may contain 8, 16, or more or less number of the physical sectors, and the number and the size of the physical sectors are not limited in the present invention.

In the present exemplary embodiment, the rewritable non-volatile memory module 1206 may be a multi-level cell (MLC) NAND flash memory module (i.e., a flash memory module capable of storing data of at least 2 bits in one memory cell). However, the present invention is not limited thereto, and the rewritable non-volatile memory module 1206 may also be a single-level cell (SLC) NAND flash memory module, a trinary-level cell (TLC) NAND flash memory module, any other flash memory module, or any other memory module with the same characteristics. The rewritable non-volatile memory module 1206 may also be disposed on or coupled to the MLPCB structure 12.

Based on the above, in the multi-layer printed circuit board structure, the connector module and the memory storage device of at least one exemplary embodiment of the present invention, the wires that should commonly be laid out on the first layout layer are changed to be laid out on the second layout layer, and the shielding element is disposed on the corresponding position on the first layout layer. Thereby, the EMI caused to the nearby electronic apparatuses due to the signal transmitted on the wires can be effectively reduced.

The previously described exemplary embodiments of the present invention have the advantages aforementioned, wherein the advantages aforementioned not required in all versions of the present invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A multi-layer printed circuit board (MLPCB) structure, suitable for being connected with a connector, wherein the connector comprises at least one connection terminal, the MLPCB structure comprising:
a first layout layer, comprising:
a shielding element, configured to provide a grounding voltage; and
at least one pad, coupled to the at least one connection terminal; and
a second layout layer, disposed corresponding to the first layout layer and comprising at least one wire,
wherein one end of each wire is coupled to one of the at least one pad,
wherein a projection plane of the shielding element projected on the second layout layer covers a predefined proportion of the at least one wire.

2. The MLPCB structure according to claim 1, wherein the projection plane completely covers the at least one wire.

3. The MLPCB structure according to claim 1, wherein an area of the projection plane is at least 10% of an area of the first layout layer.

4. The MLPCB structure according to claim 1, wherein the MLPCB structure has a first side and a second side which are opposite to each other, the connector is near the first side, and a position of the shielding element is near the first side on the first layout layer.

5. The MLPCB structure according to claim 1, wherein the at least one wire comprises a signal-transmitting wire, a signal-receiving wire or a combination thereof.

6. The MLPCB structure according to claim 1, wherein the connector is suitable for being inserted into a slot of a host system to be coupled to the host system.

7. A connector module, comprising:
a connector, comprising at least one connection terminal; and
a MLPCB structure, connected with the connector and comprising:
a first layout layer, comprising:
a shielding element, configured to provide grounding voltage; and
at least one pad, coupled to the at least one connection terminal; and
a second layout layer, disposed corresponding to the first layout layer and comprising at least one wire,
wherein one end of each wire is coupled to one of the at least one pad,
wherein a projection plane of the shielding element projected on the second layout layer covers a predefined proportion of the at least one wire.

8. The connector module according to claim 7, wherein the shielding element completely covers the at least one wire.

9. The connector module according to claim 7, wherein an area of the shielding element is at least 10% of an area of the first layout layer.

10. The connector module according to claim 7, wherein the MLPCB structure has a first side and a second side which are opposite to each other, the connector is near the first side, and a position of the shielding element is near the first side on the first layout layer.

11. The connector module according to claim 7, wherein the at least one wire comprises a signal-transmitting wire, a signal-receiving wire or a combination thereof.

12. The connector module according to claim 7, wherein the connector is suitable for being inserted into a slot of a host system to be coupled to the host system.

13. A memory storage device, comprising:
a connector, comprising at least one connection terminal;
a connection interface unit;
a rewritable non-volatile memory module, comprising a plurality of physical erasing units;
a memory controlling circuit unit, coupled to the connection interface unit and the rewritable non-volatile memory module; and an MLPCB structure, connected to the connector and configured to disposing the connection interface unit or the memory controlling circuit unit, wherein the MLPCB structure comprises:
  a first layout layer, comprising:
    a shielding element, configured to provide grounding voltage; and
    at least one pad, coupled to the at least one connection terminal; and
  a second layout layer, disposed corresponding to the first layout layer and comprising at least one wire, wherein one end of each wire is coupled to one of the at least one pad, wherein a projection plane of the shielding element projected on the second layout layer covers a predefined proportion of the at least one wire.

14. The memory storage device according to claim 13, wherein the shielding element completely covers the at least one wire.

15. The memory storage device according to claim 13, wherein an area of the shielding element is at least 10% of an area of the first layout layer.

16. The memory storage device according to claim 13, wherein the MLPCB structure has a first side and a second side which are opposite to each other, the connector is near the first side, and a position of the shielding element is near the first side on the first layout layer.

17. The memory storage device according to claim 13, wherein the at least one wire comprises a signal-transmitting wire, a signal-receiving wire or a combination thereof.

18. The memory storage device according to claim 13, wherein the connector is suitable for being inserted into a slot of a host system to be coupled to the host system.

* * * * *